United States Patent
Yokoyama

(10) Patent No.: US 11,996,828 B2
(45) Date of Patent: May 28, 2024

(54) FILTER DEVICE

(71) Applicant: Murata Manufacturing Co., Ltd., Nagaokakyo (JP)

(72) Inventor: Jin Yokoyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 338 days.

(21) Appl. No.: 17/556,233

(22) Filed: Dec. 20, 2021

(65) Prior Publication Data

US 2022/0116021 A1 Apr. 14, 2022

Related U.S. Application Data

(63) Continuation of application No. PCT/JP2020/024632, filed on Jun. 23, 2020.

(30) Foreign Application Priority Data

Jun. 24, 2019 (JP) .................. 2019-116418

(51) Int. Cl.
*H03H 9/56* (2006.01)
*H03H 9/13* (2006.01)
*H03H 9/205* (2006.01)

(52) U.S. Cl.
CPC .............. *H03H 9/568* (2013.01); *H03H 9/13* (2013.01); *H03H 9/205* (2013.01)

(58) Field of Classification Search
CPC .......... H03H 9/568; H03H 9/13; H03H 9/205; H03H 9/02992; H03H 9/6483; H03H 9/02574

(Continued)

(56) References Cited

U.S. PATENT DOCUMENTS 10,840,878 B2 * 11/2020 Daimon ................... H03H 9/25
2015/0280689 A1 10/2015 Nakamura et al.
(Continued)

FOREIGN PATENT DOCUMENTS

| JP | 2015-188123 A | 10/2015 |
| WO | 2014/192755 A1 | 12/2014 |

(Continued)

OTHER PUBLICATIONS

Official Communication issued in International Patent Application No. PCT/JP2020/024632, mailed on Aug. 18, 2020.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

A filter device includes a piezoelectric substrate including a high acoustic velocity material layer and a piezoelectric layer, and series and parallel arm resonators on the piezoelectric substrate. The parallel arm resonator includes a first IDT electrode on the piezoelectric substrate, and the series arm resonator includes a second IDT electrode on the piezoelectric substrate. First and second busbars of the first IDT electrode include opening formation regions, and an occupancy ratio of areas of openings in the first and second busbars of the first IDT electrode is greater than an occupancy ratio of areas of openings in first and second busbars of the second IDT electrode. In the first and second IDT electrodes, low acoustic velocity regions sandwich a central region. A high acoustic velocity region is provided in the opening formation region of each of the first and second busbars in the first IDT electrode.

18 Claims, 10 Drawing Sheets

(58) Field of Classification Search
USPC .......................................... 333/133, 193–196
See application file for complete search history.

(56) References Cited

U.S. PATENT DOCUMENTS

| | | |
|---|---|---|
| 2016/0065176 A1 | 3/2016 | Taniguchi et al. |
| 2018/0097508 A1 | 4/2018 | Iwamoto et al. |
| 2020/0067489 A1 | 2/2020 | Takata |

FOREIGN PATENT DOCUMENTS

| | | |
|---|---|---|
| WO | 2016/208446 A1 | 12/2016 |
| WO | 2018/225650 A1 | 12/2018 |

\* cited by examiner

FILTER DEVICE

CROSS REFERENCE TO RELATED APPLICATIONS

This application claims the benefit of priority to Japanese Patent Application No. 2019-116418 filed on Jun. 24, 2019 and is a Continuation Application of PCT Application No. PCT/JP2020/024632 filed on Jun. 23, 2020. The entire contents of each application are hereby incorporated herein by reference.

BACKGROUND OF THE INVENTION

1. Field of the Invention

The present invention relates to filter devices.

2. Description of the Related Art

Acoustic wave filter devices have been widely used for filters of mobile phones, and the like. International Publication No. WO 2014/192755 discloses an example of an acoustic wave filter device using a piston mode. In this acoustic wave filter device, an interdigital transducer (IDT) electrode is provided on a piezoelectric substrate. A central region, a low acoustic velocity region, and a high acoustic velocity region are arranged in that order from an inner side portion toward an outer side portion in an overlap width direction of electrode fingers of the IDT electrode. A busbar of the IDT electrode includes an inner busbar portion, an outer busbar portion, and a plurality of wiring lines connecting the inner busbar portion and the outer busbar portion. The busbar of the IDT electrode includes a plurality of openings surrounded by the inner busbar portion, the outer busbar portion, and the plurality of wiring lines. The high acoustic velocity region is configured in a region where the plurality of openings are formed.

In the acoustic wave device described in International Publication No. WO 2014/192755, the plurality of wiring lines are provided in the high acoustic velocity region. The plurality of wiring lines are thin in width and have high electric resistance. As such, it is difficult to sufficiently lower the electric resistance of the IDT electrode as a whole, which may result in insertion loss of the filter device not being sufficiently reduced.

SUMMARY OF THE INVENTION

Preferred embodiments of the present invention provide filter devices that are each able to reduce insertion loss.

A filter device according to a preferred embodiment of the present invention includes a piezoelectric substrate including a high acoustic velocity material layer and a piezoelectric layer directly or indirectly on the high acoustic velocity material layer, and a series arm resonator and a parallel arm resonator on the piezoelectric substrate. An acoustic velocity of a bulk wave propagating through the high acoustic velocity material layer is higher than an acoustic velocity of an acoustic wave propagating through the piezoelectric layer, the parallel arm resonator includes a first IDT electrode on the piezoelectric substrate, and the series arm resonator includes a second IDT electrode on the piezoelectric substrate, each of the first IDT electrode and the second IDT electrode includes a first busbar and a second busbar opposing each other, a plurality of first electrode fingers each with one end connected to the first busbar, and a plurality of second electrode fingers each with one end connected to the second busbar and interdigitating with each of the plurality of first electrode fingers, when an acoustic wave propagation direction is defined as a first direction and a direction orthogonal or substantially orthogonal to the first direction is defined as a second direction, a portion in which the first electrode fingers and the second electrode fingers overlap one another in the first direction is an overlap region, and the overlap region includes a central region located in a central portion in the second direction, a first edge region on the first busbar side in the central region, and a second edge region on the second busbar side in the central region, each of the first busbar and the second busbar of at least the first IDT electrode of the first IDT electrode and the second IDT electrode includes an opening formation region in which a plurality of openings are located along the first direction, and an area occupancy ratio of the openings in the first busbar and the second busbar of the first IDT electrode is greater than an area occupancy ratio of the openings in the first busbar and the second busbar of the second IDT electrode, a low acoustic velocity region in which an acoustic velocity is lower than the acoustic velocity in the central region is provided in each of the first edge region and the second edge region of the first IDT electrode and the second IDT electrode, and a high acoustic velocity region in which an acoustic velocity is higher than the acoustic velocity in the central region is provided in the opening formation region in each of the first busbar and the second busbar of the first IDT electrode.

Filter devices according to preferred embodiments of the present invention are each able to reduce insertion loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the accompanying drawings.

It should be noted that each of the preferred embodiments described in this specification is an example, and it is possible to partially replace or combine configurations between different preferred embodiments.

Figure 1:
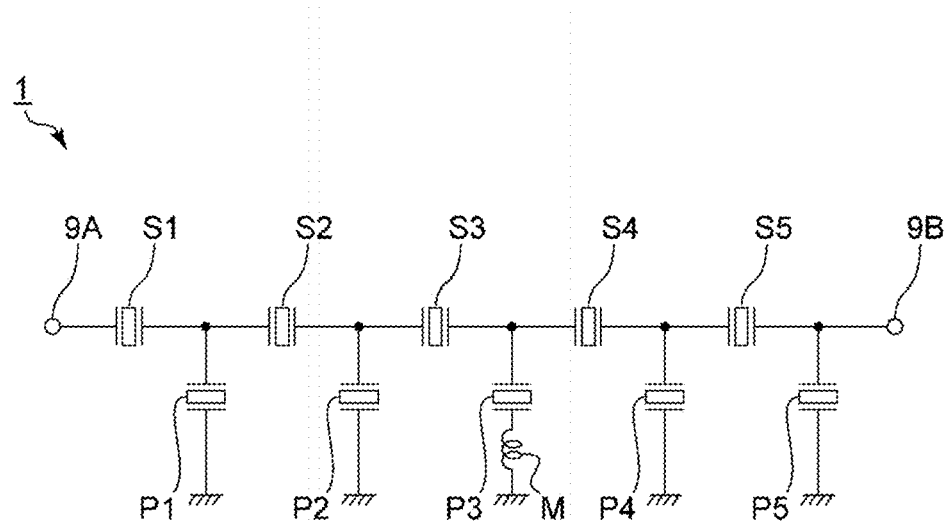
FIG. 1 is a circuit diagram of a filter device according to a first preferred embodiment of the present invention.

FIG. 1 is a circuit diagram of a filter device according to a first preferred embodiment of the present invention.

A filter device 1 is a ladder filter including a plurality of series arm resonators and a plurality of parallel arm resonators, and defines and functions as a band pass filter. The filter device 1 includes a first signal end 9A and a second signal end 9B. In the present preferred embodiment, the first signal end 9A is an antenna end to be connected to an antenna. The first signal end 9A and the second signal end 9B may be electrode pads or may be wiring lines, for example.

Series arm resonators S1, S2, S3, S4, and S5 are connected to each other in series between the first signal end 9A and the second signal end 9B. A parallel arm resonator P1 is connected between a ground potential and a connection point between the series arm resonators S1 and S2. A parallel arm resonator P2 is connected between the ground potential and a connection point between the series arm resonators S2 and S3. A parallel arm resonator P3 is connected between the ground potential and a connection point between the series arm resonators S3 and S4. A parallel arm resonator P4 is connected between the ground potential and a connection point between the series arm resonators S4 and S5. A parallel arm resonator P5 is connected between the second signal end 9B and the ground potential. In the present preferred embodiment, the series arm resonator S1 is an acoustic wave resonator that is disposed closest to the first signal end 9A side.

An inductor M is connected between the parallel arm resonator P3 and the ground potential. The circuit configuration of the filter device 1 is not limited to the above configuration, and it is sufficient for the filter device 1 to include at least one series arm resonator and at least one parallel arm resonator.

The filter device 1 includes a piezoelectric substrate. In the present preferred embodiment, the plurality of series arm resonators and the plurality of parallel arm resonators are a plurality of acoustic wave resonators provided on the piezoelectric substrate. Hereinafter, the series arm resonators and the parallel arm resonators of the filter device 1 will be described in detail.

Figure 2:
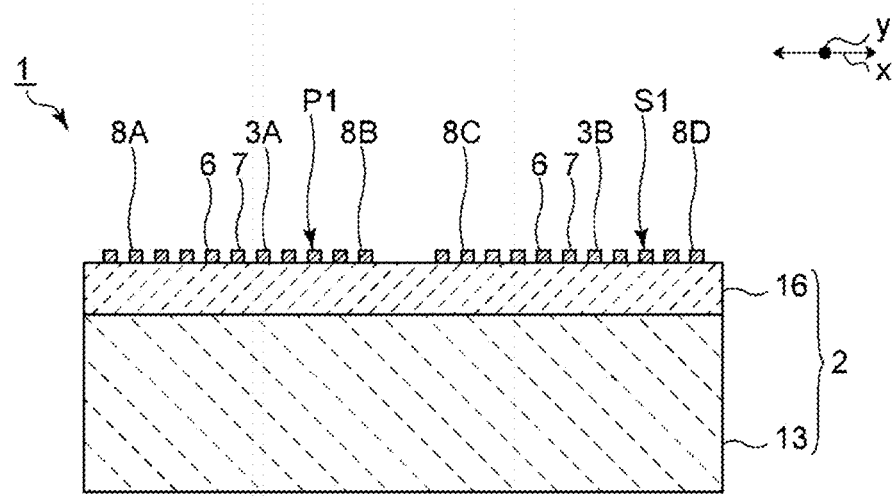
FIG. 2 is a schematic elevational cross-sectional view illustrating a series arm resonator and a parallel arm resonator in the first preferred embodiment of the present invention.

FIG. 2 is a schematic elevational cross-sectional view illustrating the series arm resonator and the parallel arm resonator in the first preferred embodiment. In FIG. 2, the series arm resonator and the parallel arm resonator are schematically arranged and shown. It is not necessary for the series arm resonator and the parallel arm resonator to be disposed adjacent to each other.

The filter device 1 includes a piezoelectric substrate 2. A plurality of first IDT electrodes 3A and a plurality of second IDT electrodes 3B are provided on the piezoelectric substrate 2. By applying an AC voltage to the first IDT electrode 3A or the second IDT electrode 3B, an acoustic wave is excited. When an acoustic wave propagation direction is defined as a first direction x and a direction orthogonal or substantially orthogonal to the first direction x is defined as a second direction y, a pair of reflectors 8A and 8B are provided on both sides of the first IDT electrode 3A in the first direction x on the piezoelectric substrate 2. A pair of reflectors 8C and 8D are provided on both sides of the second IDT electrode 3B in the first direction x on the piezoelectric substrate 2.

As illustrated in FIG. 2, the parallel arm resonator P1 includes the first IDT electrode 3A and the reflectors 8A and 8B, and the series arm resonator S1 includes the second IDT electrode 3B and the reflectors 8C and 8D.

The piezoelectric substrate 2 includes a high acoustic velocity support substrate 13 defining and functioning as a high acoustic velocity material layer and a piezoelectric layer 16 provided directly on the high acoustic velocity support substrate 13. As a material of the piezoelectric layer 16, for example, lithium tantalate, lithium niobate, zinc oxide, aluminum nitride, quartz crystal, or PZT may be used.

The high acoustic velocity material layer is a relatively high acoustic velocity layer. More specifically, the acoustic velocity of a bulk wave propagating through the high acoustic velocity material layer is higher than the acoustic velocity of an acoustic wave propagating through the piezoelectric layer 16. As a material of the high acoustic velocity support substrate 13, for example, a medium including any of the following materials as a main ingredient may be used: silicon, aluminum oxide, silicon carbide, silicon nitride, silicon oxynitride, sapphire, lithium tantalate, lithium niobate, quartz crystal, alumina, zirconia, cordierite, mullite, steatite, forsterite, magnesia, a diamond-like carbon (DLC) film, and diamond.

Since the piezoelectric substrate 2 includes a laminated structure in which the high acoustic velocity support substrate 13 and the piezoelectric layer 16 are laminated, acoustic waves may be effectively confined to the piezoelectric layer 16 side.

Figure 3:
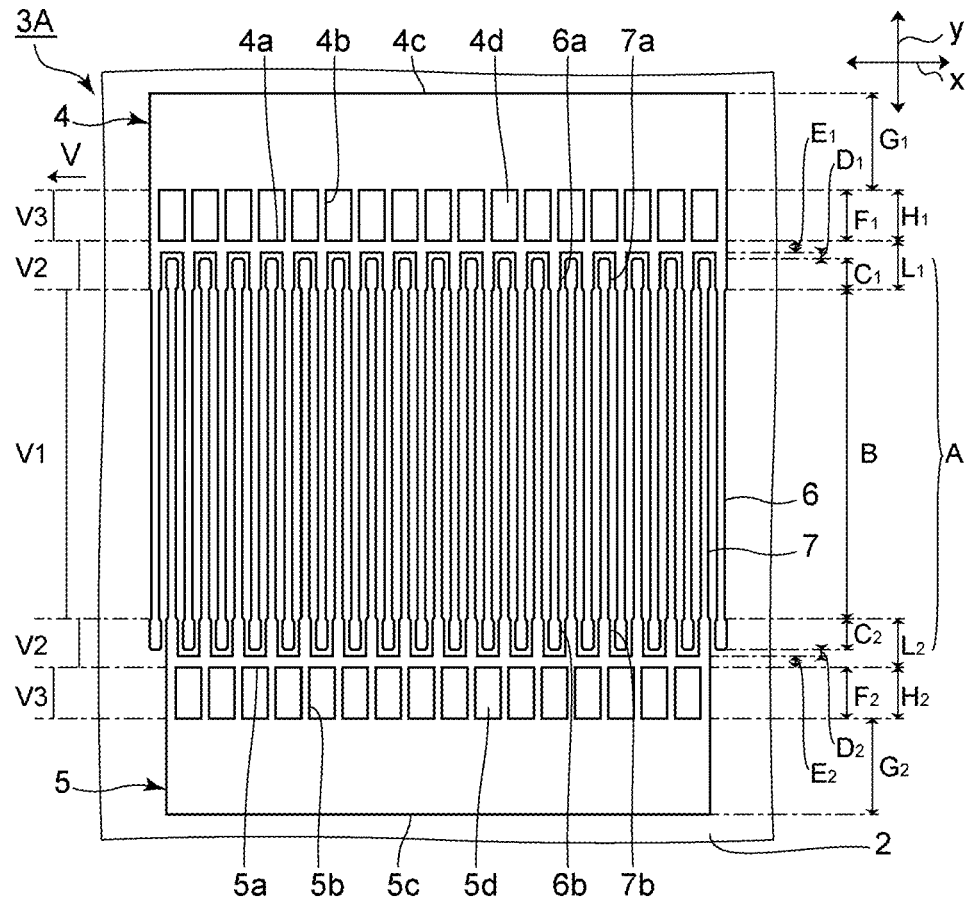
FIG. 3 is a plan view of a first IDT electrode in a parallel arm resonator of the first preferred embodiment of the present invention.
Figure 4:
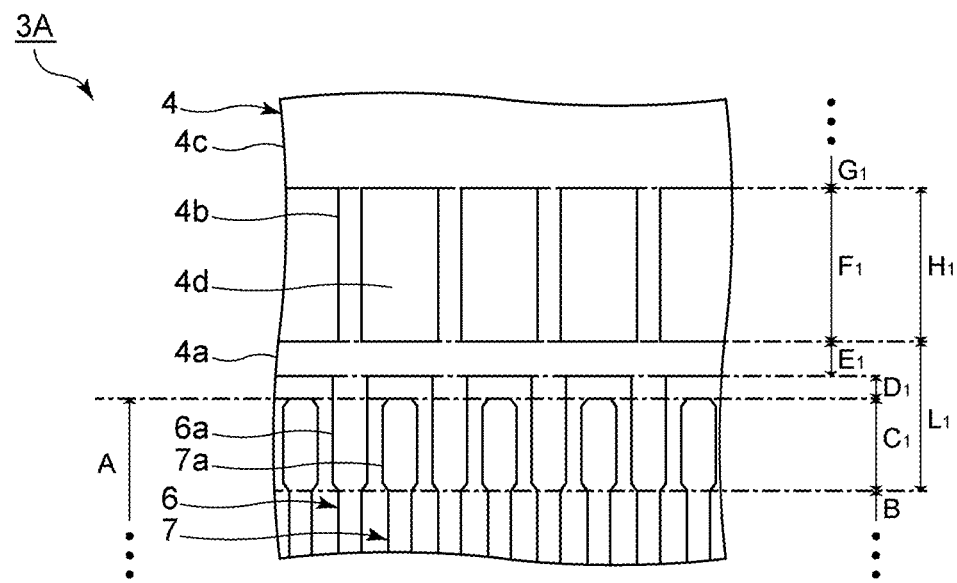
FIG. 4 is an enlarged view of FIG. 3.
Figure 5:
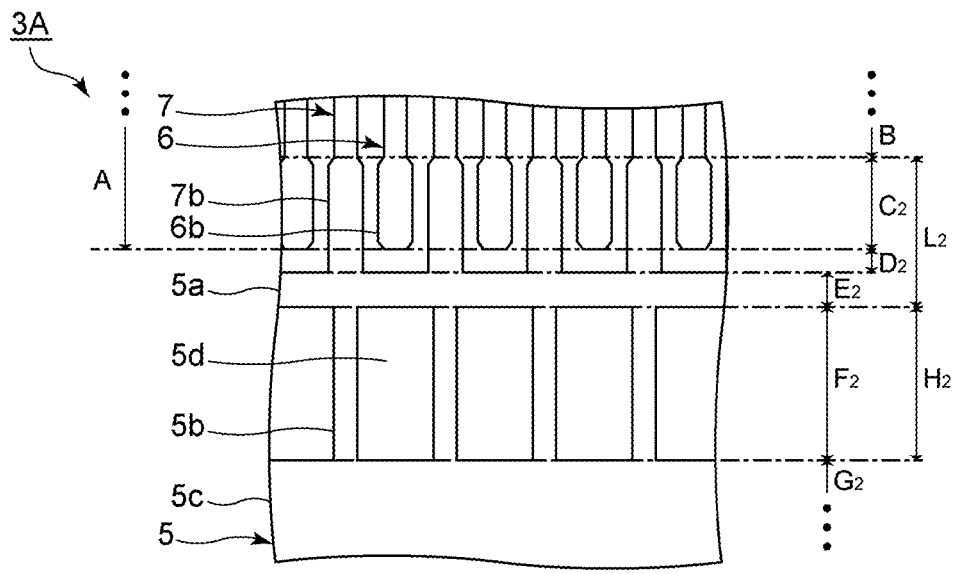
FIG. 5 is an enlarged view of FIG. 3 showing a portion different from FIG. 4.

FIG. 3 is a plan view of the first IDT electrode in the parallel arm resonator of the first preferred embodiment. FIG. 4 is an enlarged view of FIG. 3. FIG. 5 is an enlarged view of FIG. 3 depicting a portion different from FIG. 4. Wiring lines connected to the parallel arm resonator are omitted.

As illustrated in FIG. 3, the first IDT electrode 3A includes a first busbar 4 and a second busbar 5 opposing each other. The first busbar 4 includes a plurality of first openings 4d along the first direction x. The second busbar 5 also includes a plurality of second openings 5d along the first direction x. The first IDT electrode 3A includes a plurality of first electrode fingers 6 each with one end connected to the first busbar 4. The other end of the first electrode finger 6 faces the second busbar 5 with a gap therebetween. The first IDT electrode 3A includes a plurality of second electrode fingers 7 each with one end connected to the second busbar 5. The other end of the second electrode finger 7 faces the first busbar 4 with a gap therebetween. The plurality of first electrode fingers 6 and the plurality of second electrode fingers 7 are interdigitated with one another.

In the first IDT electrode 3A, a portion where the first electrode fingers 6 and the second electrode fingers 7 overlap one another in the first direction x is an overlap region A. The overlap region A includes a central region B located in a central portion in the second direction y.

The overlap region A includes a first edge region $C_1$ on the first busbar 4 side of the central region B and a second edge region $C_2$ on the second busbar 5 side of the central region B. The first IDT electrode 3A includes a first gap region $D_1$ between the first edge region $C_1$ and the first busbar 4, and a second gap region $D_2$ between the second edge region $C_2$ and the second busbar 5.

As illustrated in FIG. 4, the first busbar 4 of the first IDT electrode 3A includes a first inner busbar region $E_1$ on the overlap region A side and a first outer busbar region $G_1$ in the outer side portion in the second direction y relative to the first inner busbar region $E_1$. In the first busbar 4, a portion located in the first inner busbar region $E_1$ is a first inner busbar portion 4a, and a portion located in the first outer busbar region $G_1$ is a first outer busbar portion 4c. The first busbar 4 includes a first opening formation region $F_1$ located between the first inner busbar region $E_1$ and the first outer busbar region $G_1$, and including the plurality of first openings 4d. The first busbar 4 includes a plurality of first connection electrodes 4b connecting the first inner busbar portion 4a and the first outer busbar portion 4c. Each of the plurality of first openings 4d is an opening surrounded by the first inner busbar portion 4a, the first outer busbar portion 4c, and the plurality of first connection electrodes 4b.

The plurality of first connection electrodes 4b extend to be located on the lines extended from the plurality of first electrode fingers 6. The width of the first connection electrode 4b is the same or substantially the same as the width of the first electrode finger 6 in the central region B. The plurality of first connection electrodes 4b are not limited to the above arrangement, and may extend to be located on the lines extended from the plurality of second electrode fingers 7, for example. The width of the first connection electrode 4b may be different from the width of the first electrode finger 6 in the central region B.

Similarly, as illustrated in FIG. 5, the second busbar 5 of the first IDT electrode 3A includes a second inner busbar region $E_2$, a second outer busbar region $G_2$, and a second opening formation region $F_2$, in which the plurality of second openings 5d are provided. A portion located in the second inner busbar region $E_2$ is a second inner busbar portion 5a, and a portion located in the second outer busbar region $G_2$ is a second outer busbar portion 5c. The second busbar 5 includes a plurality of second connection electrodes 5b connecting the second inner busbar portion 5a and the second outer busbar portion 5c. Each of the plurality of second openings 5d is an opening surrounded by the second inner busbar portion 5a, the second outer busbar portion 5c, and the plurality of second connection electrodes 5b.

The plurality of first openings 4d may or may not be entirely surrounded by the first inner busbar portion 4a, the first outer busbar portion 4c, and the plurality of first connection electrodes 4b. Similarly, the plurality of second openings 5d may or may not be entirely surrounded by the second inner busbar portion 5a, the second outer busbar portion 5c, and the plurality of second connection electrodes 5b.

As shown in FIG. 3, each of the plurality of first openings 4d is entirely surrounded by the first inner busbar portion 4a, the first outer busbar portion 4c, and the plurality of first connection electrodes 4b, and each of the plurality of second openings 5d is entirely surrounded by the second inner busbar portion 5a, the second outer busbar portion 5c, and the plurality of second connection electrodes 5b. However, the first inner busbar portion 4a may be chipped or cut such that one or more of the plurality of first openings 4d and the first gap region $D_1$ are connected. Similarly, the second inner busbar portion 5a may be chipped or cut such that one or more of the plurality of second openings 5d and the first gap region $D_2$ are connected.

The dimensions of the first electrode fingers 6 and the second electrode fingers 7 along the first direction x are referred to as widths. As illustrated in FIG. 4, the first electrode finger 6 of the first IDT electrode 3A includes a first wide width portion 6a, in a portion located in the first edge region $C_1$, which is wider in width than a portion located in the central region B. Similarly, the second electrode finger 7 includes a first wide width portion 7a in a portion located in the first edge region $C_1$. As a result, the acoustic velocity in the first edge region $C_1$ is lower than the acoustic velocity in the central region B. In this manner, a first low acoustic velocity region $L_1$, in which the average acoustic velocity is lower than the acoustic velocity in the central region B, extends from the first edge region $C_1$ to the first inner busbar region $E_1$.

As illustrated in FIG. 5, the first electrode finger 6 includes a second wide width portion 6b, in a portion located in the second edge region $C_2$, which is wider in width than a portion located in the central region B. Similarly, the second electrode finger 7 includes a second wide width portion 7b in a portion located in the second edge region $C_2$. In this manner, a second low acoustic velocity region $L_2$, in which the average acoustic velocity is lower than the acoustic velocity in the central region B, extends from the second edge region $C_2$ to the second inner busbar region $E_2$.

It is only required that at least one of the first electrode finger 6 and the second electrode finger 7 illustrated in FIG. 3 includes the first wide width portion 6a or the first wide width portion 7a. It is only required that at least one of the first electrode finger 6 and the second electrode finger 7 includes the second wide width portion 6b or the second wide width portion 7b. Alternatively, the first low acoustic velocity region $L_1$ may be provided by a mass addition film being provided in a portion located in the first edge region $C_1$ of at least one of the first electrode finger 6 and the second electrode finger 7. The same applies to the second edge region $C_2$. By the first wide width portion 6a, the first wide width portion 7a, the second wide width portion 6b, the second wide width portion 7b, and the mass addition film being provided, the first low acoustic velocity region $L_1$ and the second low acoustic velocity region $L_2$ may be provided.

When the acoustic velocity in the central region B is V1 and the acoustic velocity in the first low acoustic velocity region $L_1$ as well as in the second low acoustic velocity region $L_2$ is V2, a relationship of V2<V1 is satisfied.

The plurality of first connection electrodes 4b in the first opening formation region $F_1$ are located on the lines extended from the plurality of first electrode fingers 6, but are not located on the lines extended from the plurality of second electrode fingers 7. Thus, the acoustic velocity in the first opening formation region $F_1$ is higher than the acoustic velocity in the central region B. In this manner, a first high acoustic velocity region $H_1$ is provided in the first opening formation region $F_1$. Similarly, a second high acoustic velocity region $H_2$, in which the acoustic velocity is higher than the acoustic velocity in the central region B, is provided in the second opening formation region $F_2$. When the acoustic velocity in the first high acoustic velocity region $H_1$ and the second high acoustic velocity region $H_2$ is V3, a relationship of V1<V3 is satisfied. In this specification, the first high acoustic velocity region $H_1$ and the second high acoustic velocity region $H_2$ may be simply referred to as high acoustic velocity regions. Similarly, the first low acoustic velocity region $L_1$ and the second low acoustic velocity region $L_2$ may be simply referred to as low acoustic velocity regions.

A relationship of V2<V1<V3 represents the relationship of the acoustic velocities in the respective regions. The relationship of the acoustic velocities described above is illustrated in FIG. 3. In a portion indicating the relationship of the acoustic velocities in FIG. 3, as indicated by an arrow V, the acoustic velocity is higher as the line indicating the height of each acoustic velocity is positioned leftward. The same applies to drawings other than FIG. 3.

In the second direction y, the central region B, the first low acoustic velocity region $L_1$, and the first high acoustic velocity region $H_1$ are arranged in that order. Similarly, in the second direction y, the central region B, the second low acoustic velocity region $L_2$, and the second high acoustic velocity region $H_2$ are arranged in that order. The parallel arm resonator P1 generates a piston mode by acoustic velocity differences among the central region, the low acoustic velocity region, and the high acoustic velocity region, which makes it possible to reduce or prevent a spurious signal by the transverse mode. Each of the parallel arm resonators P2, P3, P4, and P5 illustrated in FIG. 1 also includes the first IDT electrode 3A and is configured in the same or substantially the same manner as the parallel arm resonator P1. However, design parameters of the parallel arm resonators may be different from each other in accordance with desired filter characteristics. As in the present preferred embodiment, in the filter device 1, it is preferable that all of the parallel arm resonators include the first IDT electrode 3A. As a result, a spurious signal by the transverse mode may be effectively reduced or prevented.

Figure 6:
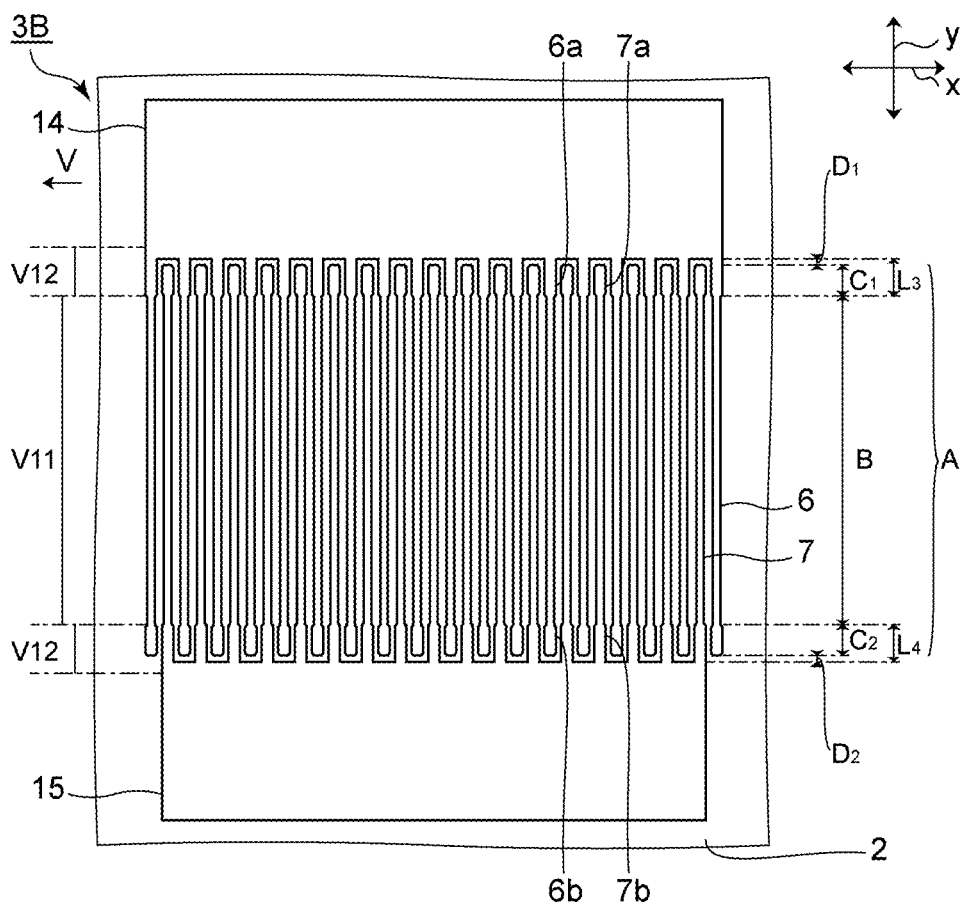
FIG. 6 is a plan view of a second IDT electrode in a series arm resonator of the first preferred embodiment of the present invention.

FIG. 6 is a plan view of the second IDT electrode in the series arm resonator of the first preferred embodiment. Wiring lines connected to the series arm resonator are omitted.

The second IDT electrode 3B includes a first busbar 14 and a second busbar 15 opposing each other. Neither the first busbar 14 nor the second busbar 15 includes an opening formation region. More specifically, in the present preferred embodiment, none of the first busbar 14 and the second busbar 15 are provided with an opening. The second IDT electrode 3B includes the plurality of first electrode fingers 6 each with one end connected to the first busbar 14. The other end of the first electrode finger 6 faces the second busbar 15 with a gap therebetween. The second IDT electrode 3B includes the plurality of second electrode fingers 7 each with one end connected to the second busbar 15. The other end of the second electrode finger 7 faces the first busbar 14 with a gap therebetween. The plurality of first electrode fingers 6 and the plurality of second electrode fingers 7 are interdigitated with one another.

The second IDT electrode 3B has the same or substantially the same configuration as that of the first IDT electrode 3A except that none of the first busbar 14 and the second busbar 15 include an opening formation region. To be more specific, the overlap region A of the second IDT electrode 3B includes the central region B located in a central portion in the second direction y. The overlap region A includes the first edge region $C_1$ arranged on the first busbar 14 side of the central region B and the second edge region $C_2$ arranged on the second busbar 15 side of the central region B. The second IDT electrode 3B includes the first gap region $D_1$ between the first edge region $C_1$ and the first busbar 14, and the second gap region $D_2$ between the second edge region $C_2$ and the second busbar 15.

The first electrode finger 6 of the second IDT electrode 3B includes the first wide width portion 6a, in a portion located in the first edge region $C_1$, which is wider in width than a portion located in the central region B. Similarly, the second electrode finger 7 includes the first wide width portion 7a in a portion located in the first edge region $C_1$. Thus, a first low acoustic velocity region $L_3$, in which the average acoustic velocity is lower than the acoustic velocity in the central region B, extends from the first edge region $C_1$ to the first gap region $D_1$.

The first electrode finger 6 includes the second wide width portion 6b, in a portion located in the second edge region $C_2$, which is wider in width than a portion located in the central region B. Similarly, the second electrode finger 7 includes the second wide width portion 7b in a portion located in the second edge region $C_2$. In this manner, a second low acoustic velocity region $L_4$, in which the average acoustic velocity is lower than the acoustic velocity in the central region B, extends from the second edge region $C_2$ to the second gap region $D_2$.

In the second IDT electrode 3B, the acoustic velocity in the central region B is V11, the acoustic velocity in the first low acoustic velocity region $L_3$ and the second low acoustic velocity region $L_4$ is V12, and a relationship of V12<V11 is satisfied. In the series arm resonator S1, a spurious signal by the transverse mode may be reduced or prevented by a piston mode generated by the acoustic velocity difference between the central region and the low acoustic velocity region.

As described above, in the present preferred embodiment, none of the first busbar 14 and the second busbar 15 in the second IDT electrode 3B include an opening formation region. Because of this, the occupancy ratio of the areas of openings in the first busbar 14 and the second busbar 15 is 0. Accordingly, the occupancy ratio of the areas of the first openings 4d and the second openings 5d in the first busbar 4 and the second busbar 5 of the first IDT electrode 3A is greater than the occupancy ratio of the areas of openings in the first busbar 14 and the second busbar 15 of the second IDT electrode 3B. The first busbar 14 and the second busbar 15 of the second IDT electrode 3B may include an opening formation region. More specifically, an opening may be provided in each of the first busbar 14 and the second busbar 15. It is sufficient that the occupancy ratio of the areas of the first openings 4d and the second openings 5d in the first busbar 4 and the second busbar 5 of the first IDT electrode 3A is greater than the occupancy ratio of the areas of openings in the first busbar 14 and the second busbar 15 of the second IDT electrode 3B.

Each of the series arm resonators S2, S3, S4, and S5 illustrated in FIG. 1 also includes the second IDT electrode 3B and is configured in the same or substantially the same manner as the series arm resonator S1. However, design parameters of the series arm resonators may be different from each other in accordance with the desired filter characteristics. In the present preferred embodiment, all of the series arm resonators include the second IDT electrode 3B. It is sufficient that at least one series arm resonator in the filter device 1 includes the second IDT electrode 3B.

The features of the present preferred embodiment are such that the parallel arm resonators and the series arm resonators are provided on the piezoelectric substrate 2 including the high acoustic velocity material layer and the piezoelectric layer 16, each parallel arm resonator includes the first IDT electrode 3A, and each series arm resonator includes the second IDT electrode 3B. Thus, the insertion loss may be reduced. Advantageous effects of the present preferred embodiment will be described below with reference to FIG. 7. To be more specific, the advantageous effects of the present preferred embodiment will be described by comparing the present preferred embodiment with a comparative example that differs from the first preferred embodiment in that each of the parallel arm resonators and series arm resonators includes the first IDT electrode 3A.

Figure 7:
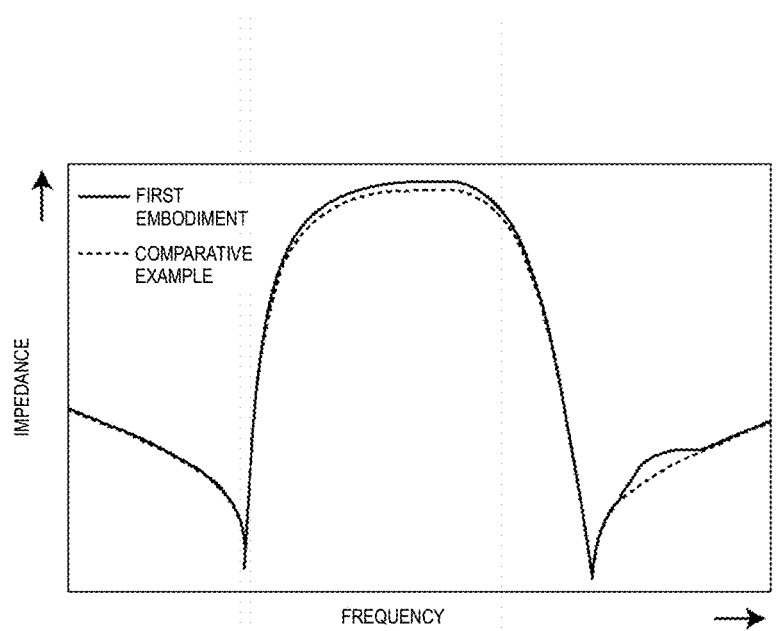
FIG. 7 is a diagram schematically showing impedance-frequency characteristics of a filter device of the first preferred embodiment of the present invention and a filter device of a comparative example.

FIG. 7 is a diagram schematically showing impedance-frequency characteristics of the filter device of the first preferred embodiment and a filter device of the comparative example. In FIG. 7, a solid line indicates a result of the first preferred embodiment, and a broken line indicates a result of the comparative example.

As shown in FIG. 7, in the first preferred embodiment in which each series arm resonator includes the second IDT electrode 3B, the insertion loss can be made smaller than that in the comparative example. The reason for this will be described below.

Figure 8:
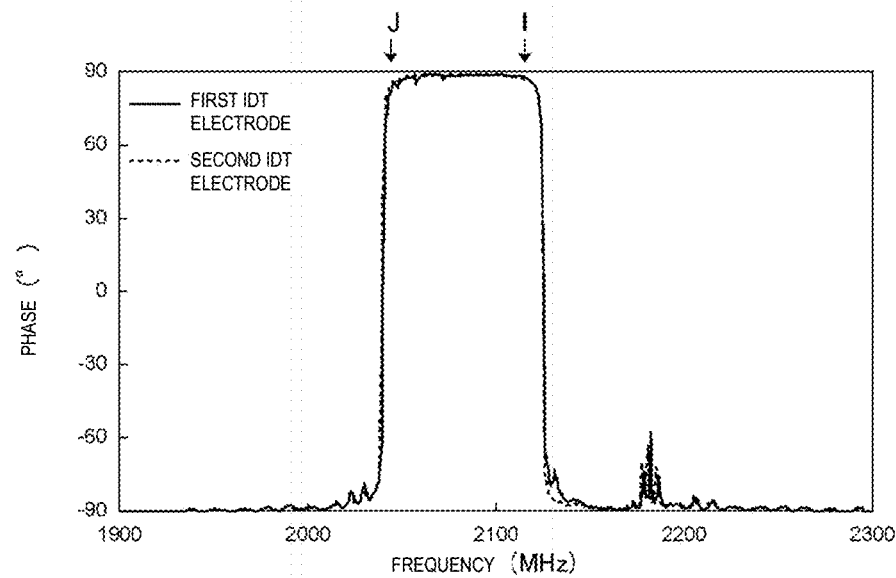
FIG. 8 is a diagram showing phase characteristics of an acoustic wave resonator including a first IDT electrode and an acoustic wave resonator including a second IDT electrode.
Figure 9:
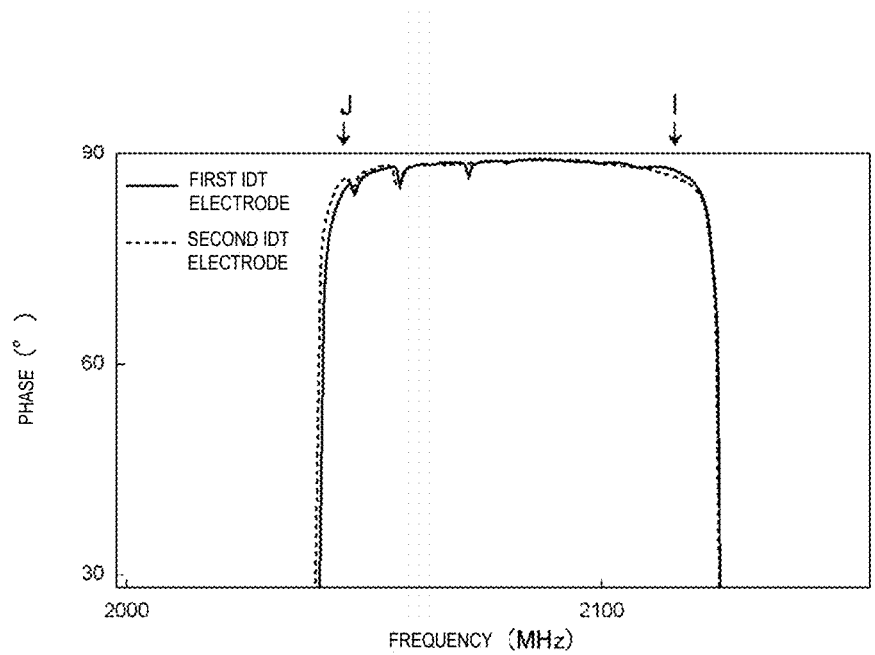
FIG. 9 is an enlarged view of FIG. 8.

FIG. 8 is a diagram showing phase characteristics of an acoustic wave resonator including the first IDT electrode 3A and an acoustic wave resonator including the second IDT electrode 3B. FIG. 9 is an enlarged view of FIG. 8. In FIGS. 8 and 9, a solid line indicates a result of the acoustic wave resonator including the first IDT electrode 3A, and a broken line indicates a result of the acoustic wave resonator including the second IDT electrode 3B.

As shown in FIGS. 8 and 9, the acoustic wave resonator including the first IDT electrode 3A has excellent phase characteristics near the anti-resonant frequency positioned on the high frequency side, as indicated by an arrow I. This is because, as illustrated in FIG. 3, since the first IDT electrode 3A includes the first high acoustic velocity region $H_1$ and the second high acoustic velocity region $H_2$, a spurious signal by the transverse mode is sufficiently reduced or prevented.

On the other hand, as shown in FIGS. 8 and 9, the acoustic wave resonator including the second IDT electrode 3B has excellent phase characteristics near the resonant frequency positioned on the low frequency side, as indicated by an arrow J. As illustrated in FIG. 6, the first busbar 14 and the second busbar of the second IDT electrode 3B include no openings. More specifically, in the first busbar 14, a metal film is continuously provided between both ends of the first busbar 14 in the first direction x. Similarly, in the second busbar 15, a metal film is continuously provided between both ends of the second busbar 15 in the first direction x. As a result, the electric resistance of the first busbar 14 and the second busbar 15 may be reduced. Accordingly, the electric resistance of the second IDT electrode 3B may be reduced overall, and the characteristics near the resonant frequency may be improved.

It is sufficient that the occupancy ratio of the areas of the first openings 4d and the second openings 5d in the first busbar 4 and the second busbar 5 of the first IDT electrode 3A is greater than the occupancy ratio of the areas of openings in the first busbar 14 and the second busbar 15 of the second IDT electrode 3B. In this case, even when the first busbar 14 and the second busbar 15 of the second IDT electrode 3B include an opening formation region, the first busbar 14 and the second busbar 15 have low electric resistance. However, as in the present preferred embodiment, it is preferable that none of the first busbar 14 and the second busbar 15 include an opening formation region. With this, the electric resistance of the first busbar 14 and second busbar 15 may be further reduced, so that the electric resistance of the second IDT electrode 3B may be further reduced overall.

Each of the parallel arm resonators defines a low frequency side in a pass band of the filter device 1 by the electric characteristics near the anti-resonant frequency. The resonant frequency of the parallel arm resonator is positioned outside of the pass band of the filter device 1. On the other hand, each series arm resonator constitutes a high frequency side in the pass band of the filter device 1 by the electric characteristics near the resonant frequency. The anti-resonant frequency of the series arm resonator is positioned outside of the pass band of the filter device 1. In the first preferred embodiment, an acoustic wave resonator including the first IDT electrode 3A with excellent characteristics near the anti-resonant frequency is used as a parallel arm resonator. Furthermore, in the first preferred embodiment, an acoustic wave resonator including the second IDT electrode 3B with excellent characteristics near the resonant frequency is used as a series arm resonator. Since the second IDT electrode 3B does not include a high acoustic velocity region, the characteristics near the anti-resonant frequency positioned on the high frequency side are influenced by the spurious signal by the transverse mode, but the above frequency region is positioned in an outer side portion of the pass band. As shown in FIG. 7, it is understood that the frequency region in which attenuation is reduced due to the above-described influence is positioned on the high frequency side relative to the pass band. Therefore, in the first preferred embodiment, the insertion loss in the pass band may be effectively reduced.

In the filter device 1, it is only required that at least one series arm resonator includes the second IDT electrode 3B, and a series arm resonator including the first IDT electrode 3A may be provided. However, it is preferable that all of the series arm resonators include the second IDT electrode 3B as in the present preferred embodiment. This makes it possible to reduce the insertion loss more effectively.

The dimension of the IDT electrode along the second direction y is defined as an overlap width, and a wavelength defined by an electrode finger pitch of the second IDT electrode 3B is λ. In the filter device 1 with the configuration of the first preferred embodiment, the overlap width of the second IDT electrode 3B was varied to compare return loss characteristics with each other. The overlap width was varied to be about 5λ, about 10λ, or about 15λ.

Figure 10:
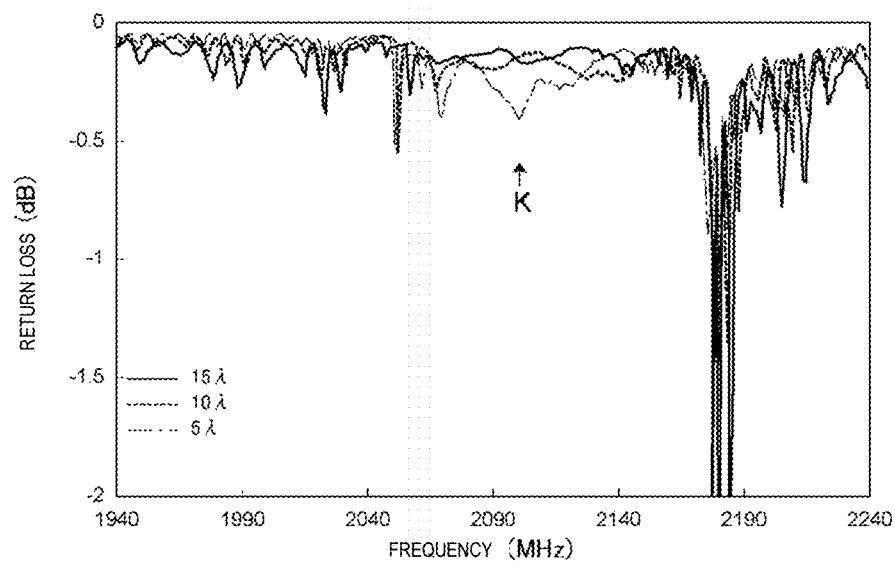
FIG. 10 is a diagram showing return loss characteristics in a case where an overlap width of a second IDT electrode is varied in the first preferred embodiment of the present invention.

FIG. 10 is a diagram showing return loss characteristics in a case where the overlap width of the second IDT electrode is varied in the first preferred embodiment. In FIG. 10, a solid line indicates a result obtained when the overlap width is about 15λ, a broken line indicates a result obtained when the overlap width is about 10λ, and a dot-dash line indicates a result obtained when the overlap width is about 5λ. An arrow K indicates a frequency region where an unnecessary wave is generated outside the pass band.

As indicated by the arrow K in FIG. 10, it is understood that the unnecessary wave outside the pass band is smaller as the overlap width is wider. As the overlap width increases, the coupling coefficient of the transverse mode decreases and the intensity of the transverse mode decreases. It is preferable for the overlap width of the second IDT electrode 3B to be greater than or equal to about 10λ, for example. As a result, unnecessary waves outside the pass band may also be effectively reduced or prevented. The upper limit of the overlap width is not particularly limited, but the overlap width is preferably smaller than or equal to about 20λ, for example. As a result, the filter device 1 may be miniaturized.

As described above, in the piezoelectric substrate 2 of the first preferred embodiment, the piezoelectric layer 16 is provided directly on the high acoustic velocity support substrate 13. However, the configuration of the piezoelectric substrate 2 is not limited thereto. Hereinafter, a first modification and a second modification of the first preferred embodiment will be described, in which only the configuration of a piezoelectric substrate differs from that of the first preferred embodiment. In the first modification and the second modification, the insertion loss may be reduced as in the first preferred embodiment.

Figure 11:
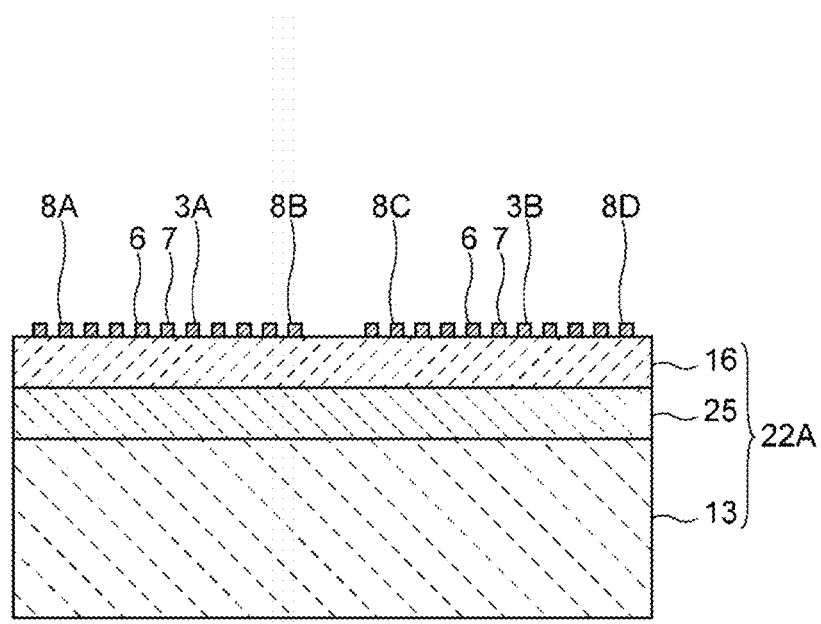
FIG. 11 is a schematic elevational cross-sectional view illustrating a series arm resonator and a parallel arm resonator in a first modification of the first preferred embodiment of the present invention.

In the first modification illustrated in FIG. 11, a piezoelectric substrate 22A includes a high acoustic velocity support substrate 13, a low acoustic velocity film 25 provided on the high acoustic velocity support substrate 13, and a piezoelectric layer 16 provided on the low acoustic velocity film 25. The low acoustic velocity film 25 is a relatively low acoustic velocity film. More specifically, the acoustic velocity of a bulk wave propagating through the low acoustic velocity film 25 is lower than the acoustic velocity of a bulk wave propagating through the piezoelectric layer 16. In this modification, the piezoelectric layer 16 is indirectly provided on the high acoustic velocity support substrate 13 as a high acoustic velocity material layer with the low acoustic velocity film 25 interposed therebetween.

As a material of the low acoustic velocity film 25, for example, silicon oxide, glass, silicon oxynitride, tantalum oxide, or a material mainly including a compound obtained by adding fluorine, carbon, or boron to silicon oxide may be used.

Figure 12:
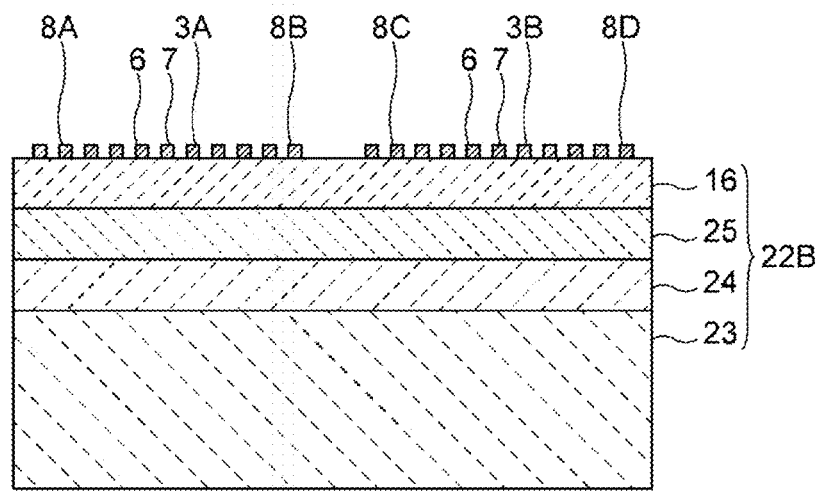
FIG. 12 is a schematic elevational cross-sectional view illustrating a series arm resonator and a parallel arm resonator in a second modification of the first preferred embodiment of the present invention.

In the second modification illustrated in FIG. 12, the high acoustic velocity material layer is a high acoustic velocity film 24. A piezoelectric substrate 22B includes a support substrate 23, the high acoustic velocity film 24 provided on the support substrate 23, a low acoustic velocity film 25 provided on the high acoustic velocity film 24, and a piezoelectric layer 16 provided on the low acoustic velocity film 25. When the piezoelectric substrate 22B includes the high acoustic velocity film 24, it is unnecessary to use a relatively high acoustic velocity material for the support substrate 23.

As a material of the support substrate 23, for example, piezoelectric materials such as aluminum oxide, lithium tantalate, lithium niobate, and quartz crystal, various ceramics such as alumina, magnesia, silicon nitride, aluminum nitride, silicon carbide, zirconia, cordierite, mullite, steatite, and forsterite, dielectrics such as sapphire, diamond, and glass, semiconductors such as silicon and gallium nitride, or resins may be used.

As a material of the high acoustic velocity film 24, for example, a medium including any of the following materials as a main ingredient may be used: aluminum oxide, silicon carbide, silicon nitride, silicon oxynitride, silicon, sapphire, lithium tantalate, lithium niobate, quartz crystal, alumina, zirconia, cordierite, mullite, steatite, forsterite, magnesia, a DLC film, and diamond.

Figure 13:
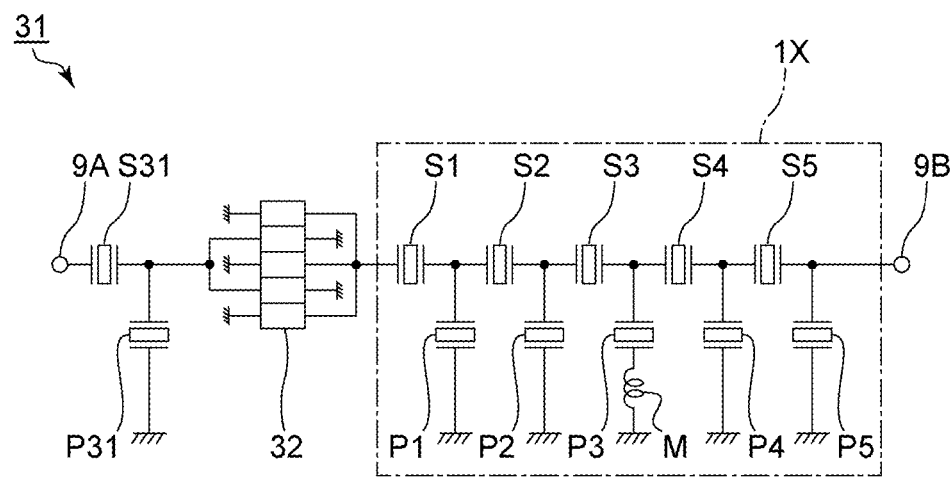
FIG. 13 is a circuit diagram of a filter device according to a second preferred embodiment of the present invention.

FIG. 13 is a circuit diagram of a filter device according to a second preferred embodiment of the present invention.

A filter device 31 of the present preferred embodiment differs from the filter device of the first preferred embodiment in that a longitudinally coupled resonator acoustic wave filter 32, a series arm resonator S31, and a parallel arm resonator P31 are included. Except for the point described above, the filter device 31 of the present preferred embodiment has the same or substantially the same configuration as the filter device 1 of the first preferred embodiment. The filter device 31 includes a ladder filter section 1X. To be more specific, the ladder filter section 1X is a section including series arm resonators S1, S2, S3, S4 and S5, and parallel arm resonators P1, P2, P3, P4, and P5.

The series arm resonator S31 and the longitudinally coupled resonator acoustic wave filter 32 are connected in series to each other between a first signal end 9A and the series arm resonator S1. The parallel arm resonator P31 is connected between a ground potential and a connection point between the series arm resonators S31 and the longitudinally coupled resonator acoustic wave filter 32. The circuit configuration of the filter device 31 is not limited to the circuit configuration described above. For example, the longitudinally coupled resonator acoustic wave filter 32 may be electrically connected to the series arm resonator or the parallel arm resonator via another element.

The longitudinally coupled resonator acoustic wave filter 32 is, for example, a 5-IDT longitudinally coupled resonator acoustic wave filter. However, the number of IDT electrodes included in the longitudinally coupled resonator acoustic wave filter 32 is not limited to five. The longitudinally coupled resonator acoustic wave filter 32 may be, for example, of a 3-IDT longitudinally coupled resonator acoustic wave filter type or a 7-IDT longitudinally coupled resonator acoustic wave filter.

In the present preferred embodiment, the series arm resonator S31 is used as a series trap, and the parallel arm resonator P31 is used as a parallel trap. The pass band of the filter device 31 is defined by the longitudinally coupled resonator acoustic wave filter 32, and a plurality of series arm resonators and a plurality of parallel arm resonators in the ladder filter section 1X.

In the present preferred embodiment, the plurality of parallel arm resonators defining the pass band includes the first IDT electrodes 3A, and the plurality of series arm resonators defining the pass band includes the second IDT electrodes 3B. Thus, as in the first preferred embodiment, the insertion loss may be reduced.

In the first preferred embodiment described above, as illustrated in FIG. 4, the first IDT electrode 3A includes the wide width portion, so that the first low acoustic velocity region $L_1$ and the second low acoustic velocity region $L_2$ are provided. However, the first low acoustic velocity region $L_1$ and the second low acoustic velocity region $L_2$ may be configured by providing a mass addition film in the first edge region $C_1$ and the second edge region $C_2$, for example. This example will be described in a third preferred embodiment of the present invention, a fourth preferred embodiment of the present invention, and a modification of the fourth preferred embodiment to be explained below. Also in the third preferred embodiment, the fourth preferred embodiment, and the modification of the fourth preferred embodiment, the insertion loss may be reduced as in the first preferred embodiment.

Figure 14:
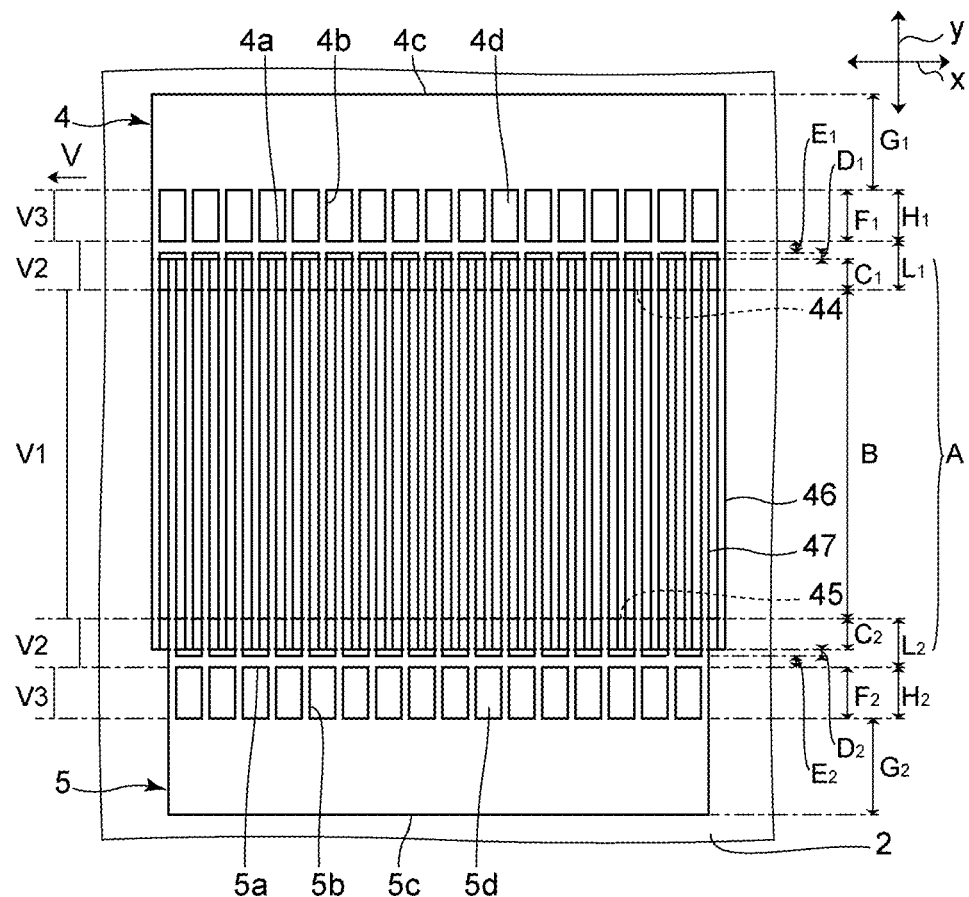
FIG. 14 is a plan view illustrating the vicinity of a first IDT electrode in a parallel arm resonator of a third preferred embodiment of the present invention.
Figure 15:
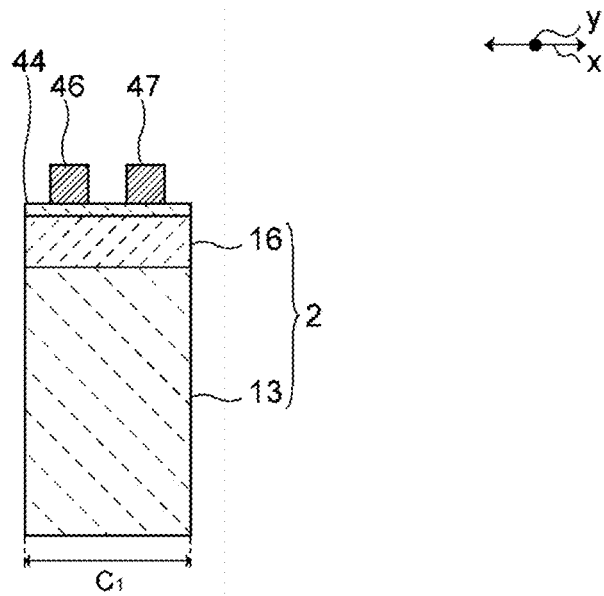
FIG. 15 is an elevational cross-sectional view illustrating the vicinity of a pair of electrode fingers in a first edge region of a parallel arm resonator in the third preferred embodiment of the present invention.
Figure 16:
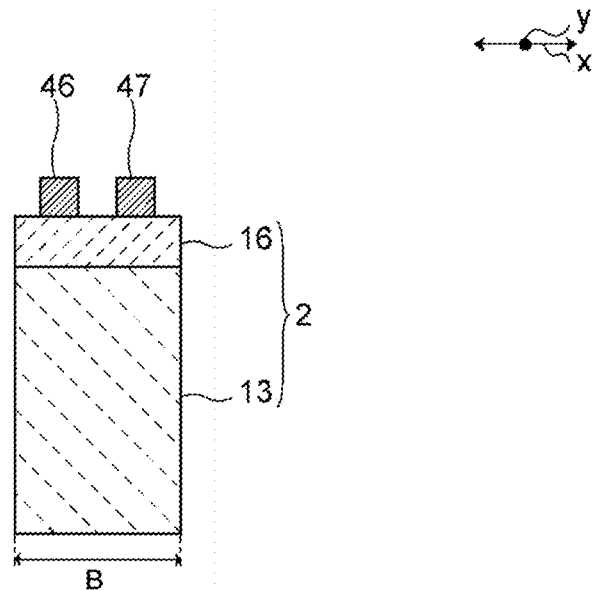
FIG. 16 is an elevational cross-sectional view illustrating the vicinity of a pair of electrode fingers in a central region of a parallel arm resonator in the third preferred embodiment of the present invention.

FIG. 14 is a plan view illustrating the vicinity of a first IDT electrode in a parallel arm resonator of the third preferred embodiment. FIG. 15 is an elevational cross-sectional view illustrating the vicinity of a pair of electrode fingers in a first edge region of the parallel arm resonator in the third preferred embodiment. FIG. 16 is an elevational cross-sectional view illustrating the vicinity of the pair of electrode fingers in a central region of the parallel arm resonator in the third preferred embodiment.

As illustrated in FIG. 14, the present preferred embodiment is different from the first preferred embodiment in the configurations of a first low acoustic velocity region $L_1$ and a second low acoustic velocity region $L_2$ in the parallel arm resonator. Further, the configurations of a first low acoustic velocity region and a second low acoustic velocity region in a series arm resonator are also different from those in the first preferred embodiment. Except for the above-described portions, a filter device of the present preferred embodiment has the same or substantially the same configuration as the filter device 1 of the first preferred embodiment.

As illustrated in FIGS. 14 and 15, in a first edge region $C_1$, one mass addition film 44 is provided between a piezoelectric substrate 2 and a plurality of first electrode fingers 46 as well as a plurality of second electrode fingers 47. Similarly, as illustrated in FIG. 14, also in a second edge region $C_2$, one mass addition film 45 is provided between the piezoelectric substrate 2 and the plurality of first electrode fingers 46 as well as the plurality of second electrode fingers 47. On the other hand, as illustrated in FIGS. 14 and 16, no mass addition film is provided in a central region B. Thus, as illustrated in FIG. 14, the first low acoustic velocity region $L_1$ and the second low acoustic velocity region $L_2$ are provided.

The mass addition film 44 has a band shape and extends to a portion between the electrode fingers on the piezoelectric substrate 2. A plurality of mass addition films 44 may be provided in the first edge region $C_1$. In this case, each mass addition film 44 may be provided between the piezoelectric substrate 2 and the first electrode finger 46 or the second electrode finger 47. The same applies to the second edge region $C_2$.

The first electrode finger 46 and the second electrode finger 47 have no wide width portion. The width of the first electrode finger 46 in the first edge region $C_1$ and the second edge region $C_2$ is the same as the width thereof in the central region B. Likewise, the width of the second electrode finger 47 in the first edge region $C_1$ and the second edge region $C_2$ is the same as the width thereof in the central region B. Even in the case where the mass addition films 44 and 45 are provided, the first electrode finger 46 and the second electrode finger 47 may have wide width portions as in the first preferred embodiment.

Similarly, in a series arm resonator, in a first edge region, a mass addition film is provided between the piezoelectric substrate and a first electrode finger as well as a second electrode finger, so that a first low acoustic velocity region is configured. In a second edge region, a mass addition film is provided between the piezoelectric substrate and the first electrode finger as well as the second electrode finger, so that a second low acoustic velocity region is provided.

Figure 17:
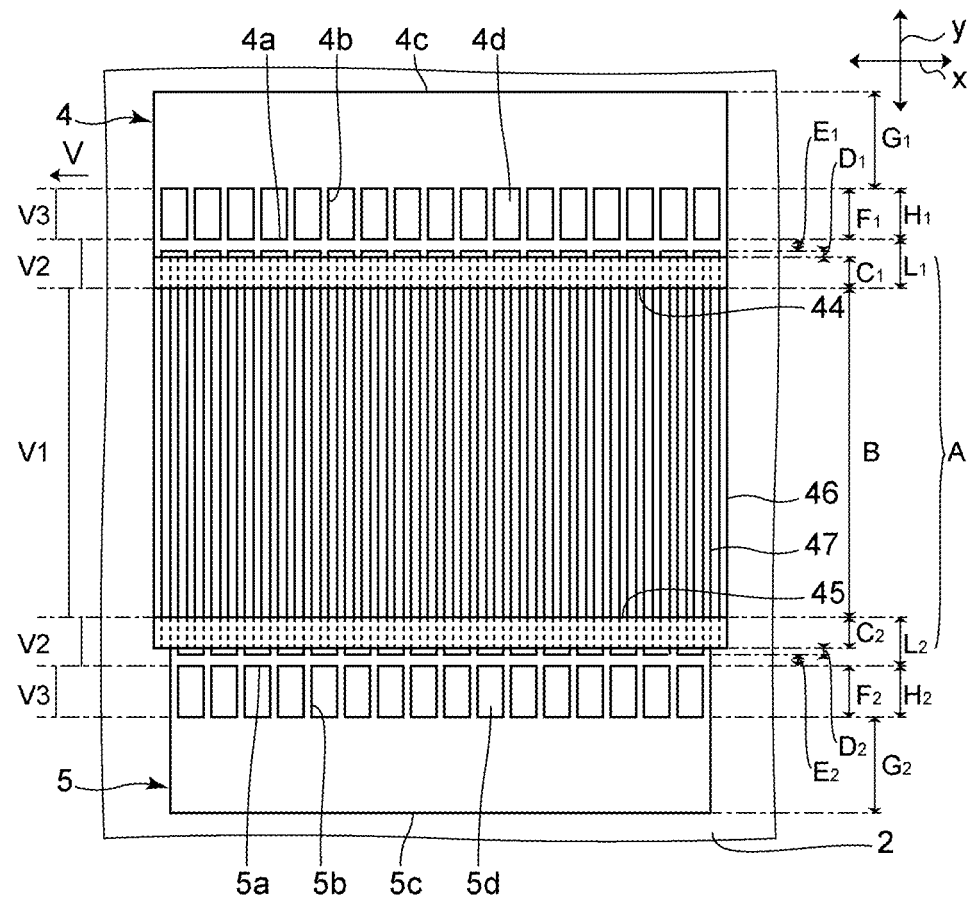
FIG. 17 is a plan view illustrating the vicinity of a first IDT electrode in a parallel arm resonator in a fourth preferred embodiment of the present invention.
Figure 18:
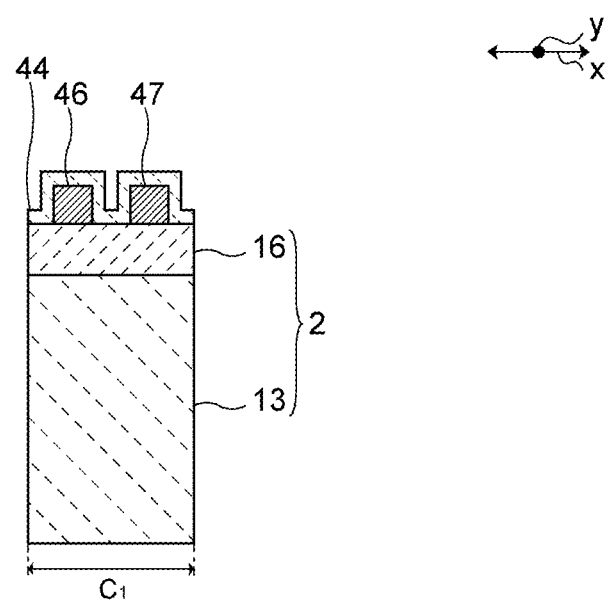
FIG. 18 is an elevational cross-sectional view illustrating the vicinity of a pair of electrode fingers in a first edge region of a parallel arm resonator in the fourth preferred embodiment of the present invention.

FIG. 17 is a plan view illustrating the vicinity of a first IDT electrode in a parallel arm resonator of the fourth preferred embodiment. FIG. 18 is an elevational cross-sectional view illustrating the vicinity of a pair of electrode fingers in a first edge region of the parallel arm resonator in the fourth preferred embodiment.

As illustrated in FIG. 17, the present preferred embodiment is different from the third preferred embodiment in the arrangement of a mass addition film in the parallel arm resonator. The arrangement of a mass addition film in a series arm resonator is also different from that of the third preferred embodiment. Except for the above-described portions, a filter device of the present preferred embodiment has the same or substantially the same configuration as the filter device of the third preferred embodiment.

As illustrated in FIGS. 17 and 18, in a first edge region $C_1$, one mass addition film 44 is provided on a piezoelectric substrate 2 so as to cover a plurality of first electrode fingers 46 and a plurality of second electrode fingers 47. Similarly, as illustrated in FIG. 17, also in a second edge region $C_2$, one mass addition film 45 is provided on the piezoelectric substrate 2 so as to cover the plurality of first electrode fingers 46 and the plurality of second electrode fingers 47. On the other hand, no mass addition film is provided in a central region B. Thus, a first low acoustic velocity region $L_1$ and a second low acoustic velocity region $L_2$ are provided.

The mass addition film 44 has a band shape and extends to a portion between the electrode fingers on the piezoelectric substrate 2. A plurality of mass addition films 44 may be provided in the first edge region $C_1$. In this case, each mass addition film 44 may be provided on the first electrode finger 46 or the second electrode finger 47. The same applies to the second edge region $C_2$.

Similarly, in a series arm resonator, in a first edge region, a mass addition film is provided on the piezoelectric substrate so as to cover a plurality of first electrode fingers and a plurality of second electrode fingers, so that a first low acoustic velocity region is provided. In a second edge region, a mass addition film is provided on the piezoelectric substrate so as to cover the first electrode fingers and the second electrode fingers, so that a second low acoustic velocity region is provided.

Figure 19:
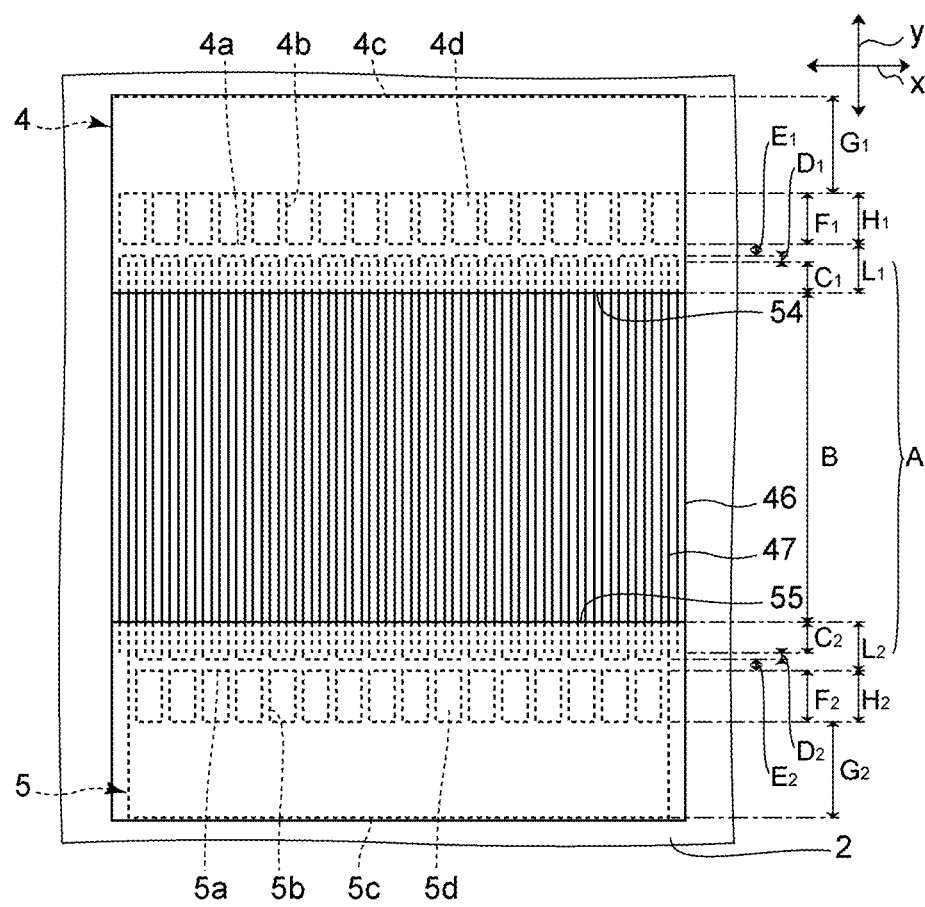
FIG. 19 is a plan view illustrating the vicinity of a first IDT electrode of a parallel arm resonator in a modification of the fourth preferred embodiment of the present invention.

In the present preferred embodiment, the mass addition film 44 is provided only in the first edge region $C_1$. The mass addition film 45 is provided only in the second edge region $C_2$. However, the present invention is not limited thereto. In the modification of the fourth preferred embodiment illustrated in FIG. 19, a mass addition film 54 is provided in a portion in addition to a first edge region $C_1$. To be more specific, the mass addition film 54 covers a plurality of first electrode fingers 46 in a first gap region $D_1$. The mass addition film 54 further covers a first busbar 4. The mass addition film 54 may cover all or a portion of the first busbar 4.

A mass addition film 55 is provided in a portion in addition to a second edge region $C_2$. To be more specific, the mass addition film 55 covers a plurality of second electrode fingers 47 in a second gap region $D_2$. The mass addition film 55 further covers a second busbar 5. The mass addition film 55 may cover all or a portion of the second busbar 5.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
    a piezoelectric substrate including a high acoustic velocity material layer and a piezoelectric layer directly or indirectly on the high acoustic velocity material layer; and
    at least one series arm resonator and at least one parallel arm resonator on the piezoelectric substrate; wherein
    an acoustic velocity of a bulk wave propagating through the high acoustic velocity material layer is higher than an acoustic velocity of an acoustic wave propagating through the piezoelectric layer;
    the at least one parallel arm resonator includes a first IDT electrode on the piezoelectric substrate, and the at least one series arm resonator includes a second IDT electrode on the piezoelectric substrate;
    each of the first IDT electrode and the second IDT electrode includes a first busbar and a second busbar opposing each other, a plurality of first electrode fingers each with one end connected to the first busbar, and a plurality of second electrode fingers each with one end connected to the second busbar and interdigitating with each of the plurality of first electrode fingers;
    where an acoustic wave propagation direction is a first direction and a direction orthogonal or substantially orthogonal to the first direction is a second direction, a portion in which the first electrode fingers and the second electrode fingers overlap one another in the first direction is an overlap region, and the overlap region includes a central region located in a central portion in the second direction, a first edge region on the first busbar side in the central region, and a second edge region on the second busbar side in the central region;
    each of the first busbar and the second busbar of the first IDT electrode includes an opening formation region in which a plurality of openings are provided along the first direction;
    a low acoustic velocity region in which an acoustic velocity is lower than the acoustic velocity in the central region is provided in each of the first edge region and the second edge region of the first IDT electrode and the second IDT electrode;
    a high acoustic velocity region in which an acoustic velocity is higher than the acoustic velocity in the central region is provided in the opening formation region in each of the first busbar and the second busbar of the first IDT electrode; and
    neither of the first busbar and the second busbar of the second IDT electrode includes the opening formation region.

2. The filter device according to claim 1, wherein each of the at least one series arm resonator includes the second IDT electrode.

3. The filter device according to claim 1, wherein, where a dimension of the overlap region along the second direction is an overlap width and a wavelength defined by an electrode finger pitch of the second IDT electrode is λ, the overlap width of the at least one series arm resonator including the second IDT electrode is greater than or equal to about 10λ.

4. The filter device according to claim 3, wherein the overlap width of the at least one series arm resonator including the second IDT electrode is less than or equal to about 20λ.

5. The filter device according to claim 1, further comprising a longitudinally coupled resonator acoustic wave filter electrically connected to the at least one series arm resonator or the at least one parallel arm resonator.

6. The filter device according to claim 1, further comprising:
    a low acoustic velocity film between the high acoustic velocity material layer and the piezoelectric layer; wherein
    an acoustic velocity of a bulk wave propagating through the low acoustic velocity film is lower than an acoustic velocity of a bulk wave propagating through the piezoelectric layer.

7. The filter device according to claim 6, wherein the low acoustic velocity film includes silicon oxide, glass, silicon oxynitride, tantalum oxide, or a material mainly including a compound obtained by adding fluorine, carbon, or boron to silicon oxide.

8. The filter device according to claim 6, further comprising:
    a support substrate; wherein
    the high acoustic velocity material layer is a high acoustic velocity film between the support substrate and the low acoustic velocity film.

9. The filter device according to claim 1, wherein an inductor is connected between the at least one parallel arm resonator and a ground.

10. The filter device according to claim 1, wherein the piezoelectric layer includes lithium tantalate, lithium niobate, zinc oxide, aluminum nitride, quartz crystal, or PZT.

11. The filter device according to claim 1, wherein the high acoustic velocity material layer includes as a main component silicon, aluminum oxide, silicon carbide, silicon nitride, silicon oxynitride, sapphire, lithium tantalate, lithium niobate, quartz crystal, alumina, zirconia, cordierite, mullite, steatite, forsterite, magnesia, a diamond-like carbon (DLC) film, or diamond.

12. The filter device according to claim 1, wherein
    the first busbar of the first IDT electrode includes a first inner busbar region and a first outer busbar region; and
    the opening formation region is between the first inner busbar region and the first outer busbar region.

13. The filter device according to claim 1, wherein
    the second busbar of the first IDT electrode includes a second inner busbar region and a second outer busbar region; and
    the opening formation region is between the second inner busbar region and the second outer busbar region.

14. The filter device according to claim 1, wherein, where dimensions of the plurality of first electrode fingers and the plurality of second electrode fingers along the first direction are widths of the plurality of first electrode fingers and the plurality of second electrode fingers, the plurality of first electrode fingers and the plurality of second electrode fingers of each of the first IDT electrode and the second IDT electrode include a wide width portion wider in width than a portion located in the central region, in portions located in the first edge region and the second edge region so as to define the low acoustic velocity regions.

15. The filter device according to claim 1, wherein the high acoustic velocity material layer is a high acoustic velocity support substrate.

16. The filter device according to claim 1, wherein the plurality of openings in the first and second busbars of the first IDT electrode are at least partially surrounded by the respective first or second busbar.

17. The filter device according to claim 16, wherein at least one of the plurality of openings in the first and second busbars of the first IDT electrode is entirely surrounded by the respective first or second busbar.

18. The filter device according to claim 1, wherein the plurality of openings in the first and second busbars of the first IDT electrode are entirely surrounded by the respective first or second busbar.

* * * * *